United States Patent
Pendse

(10) Patent No.: US 6,780,682 B2
(45) Date of Patent: Aug. 24, 2004

(54) PROCESS FOR PRECISE ENCAPSULATION OF FLIP CHIP INTERCONNECTS

(75) Inventor: Rajendra Pendse, Fremont, CA (US)

(73) Assignee: ChipPAC, Inc., Fremont, CA (US)

( * ) Notice: Subject to any disclaimer, the term of this patent is extended or adjusted under 35 U.S.C. 154(b) by 0 days.

(21) Appl. No.: 10/081,425

(22) Filed: Feb. 22, 2002

(65) Prior Publication Data

US 2002/0123173 A1 Sep. 5, 2002

Related U.S. Application Data

(60) Provisional application No. 10/272,280, filed on Feb. 27, 2001.

(51) Int. Cl.[7] ............................................. H01L 21/48
(52) U.S. Cl. ....................................... 438/127; 438/108
(58) Field of Search ................................ 438/106, 108, 438/118, 119, 124, 126, 127, 112

(56) References Cited

U.S. PATENT DOCUMENTS

| | | |
|---|---|---|
| 4,208,005 A | 6/1980 | Nate et al. |
| 5,210,938 A | 5/1993 | Hirai |
| 5,250,469 A | 10/1993 | Tanaka et al. |
| 5,346,857 A | 9/1994 | Scharr et al. |
| 5,386,624 A | 2/1995 | George et al. |
| 5,508,561 A | 4/1996 | Tago et al. |
| 5,592,736 A | 1/1997 | Akram et al. |
| 5,681,757 A | 10/1997 | Hayes |
| 5,686,317 A | 11/1997 | Akram et al. |
| 5,717,477 A | 2/1998 | Fritz et al. |
| 5,801,350 A | 9/1998 | Shibuya et al. |
| 5,829,126 A | 11/1998 | Nagao et al. |
| 5,865,365 A | 2/1999 | Nishikawa et al. |
| 5,869,904 A | 2/1999 | Shoji |
| 5,874,780 A | 2/1999 | Murakami |
| 5,892,289 A | 4/1999 | Tokuno |
| 5,925,936 A * | 7/1999 | Yamaji .......................... 257/787 |
| 5,931,371 A | 8/1999 | Pao et al. |
| 5,953,814 A | 9/1999 | Sozansky et al. |
| 6,037,192 A | 3/2000 | Witzman et al. |
| 6,087,731 A | 7/2000 | Lake |
| 6,097,098 A * | 8/2000 | Ball ............................ 257/786 |
| 6,130,476 A | 10/2000 | LaFontaine, Jr. et al. |
| 6,153,940 A | 11/2000 | Zakel et al. |
| 6,173,887 B1 | 1/2001 | Mead et al. |
| 6,184,066 B1 * | 2/2001 | Chino et al. ................. 438/118 |
| 6,194,788 B1 | 2/2001 | Gilleo et al. |
| 6,214,642 B1 | 4/2001 | Chen et al. |
| 6,225,144 B1 | 5/2001 | How et al. |

(List continued on next page.)

FOREIGN PATENT DOCUMENTS

JP 403055860 A 3/1991

*Primary Examiner*—Evan Pert
*Assistant Examiner*—Scott B. Geyer
(74) *Attorney, Agent, or Firm*—Bill Kennedy; Haynes Beffel & Wolfeld LLP

(57) ABSTRACT

A method for encapsulating flip chip interconnects includes applying a limited quantity of encapsulating resin to the interconnect side of an integrated circuit chip, and thereafter bringing the chip together with a substrate under conditions that promote the bonding of bumps on the interconnect side of the chip with bonding pads on the substrate. In some embodiments, the step of applying resin to the chip includes dipping the interconnect side of the chip to a predetermined depth in a pool of resin, and then withdrawing the chip from the resin pool. In some embodiments the step of applying resin to the chip includes providing a reservoir having a bottom, providing a pool of resin in the reservoir to a shallow depth over the reservoir bottom, dipping the chip into the resin pool so that the bumps contact the reservoir bottom, and then withdrawing the chip from the resin pool. Also, apparatus for applying a precise volume of encapsulating resin to a chip, includes a reservoir having a bottom, and means for dispensing a pool of encapsulating resin to a predetermined depth over the reservoir bottom.

9 Claims, 1 Drawing Sheet

U.S. PATENT DOCUMENTS

| | | | |
|---|---|---|---|
| 6,297,560 B1 | * 10/2001 | Capote et al. | 257/778 |
| 6,323,062 B1 | * 11/2001 | Gilleo et al. | 438/114 |
| 6,324,069 B1 | 11/2001 | Weber | |
| 6,326,234 B1 | 12/2001 | Nakamura | |
| 6,337,522 B1 | 1/2002 | Kang et al. | |
| 6,367,150 B1 | * 4/2002 | Kirsten | 29/840 |
| 6,376,352 B1 | 4/2002 | Arnold et al. | |
| 6,420,213 B1 | * 7/2002 | Nakajyo et al. | 438/118 |
| 6,576,495 B1 | * 6/2003 | Jiang et al. | 438/108 |

* cited by examiner

PROCESS FOR PRECISE ENCAPSULATION OF FLIP CHIP INTERCONNECTS

CROSS REFERENCE TO RELATED APPLICATION

This application claims priority from Provisional application No. 60/272,280, filed Feb. 27, 2001.

BACKGROUND

This invention relates to semiconductor device packaging and, particularly, to flip chip packages.

Flip chip packages include an integrated circuit chip connected to a package substrate by way of interconnect bumps which are mounted on the integrated circuit chip in arrangement corresponding to the arrangement to metal contact pads on substrate. During package assembly the chip and substrate are apposed with the corresponding bumps and pads aligned, and then the chip and substrate are brought together under conditions that promote the bonding of the bumps on the metal pads.

Flip chip devices are conventionally encapsulated to improve the reliability of the interconnections between the chip and the substrate. Ordinarily the encapsulation is carried out using one of two approaches.

In the first approach, commonly known as "under filling", encapsulation is carried out following formation of the interconnections between the chip and substrate, by dispensing the encapsulating resin into the gap between the chip in the substrate near an outer edge of the chip, and then allowing the resin to move into the gap between the chip and the substrate by capillary action. This approach carries a high processing cost, because the under filling process is time-consuming and high throughput cannot be achieved. Moreover, a significant space must be provided between adjacent devices to accommodate the dispensed resin bead at the edge of each chip this requirement for extra space between adjacent devices limits of substrate utilization in high-density applications.

In a second approach, a quantity of encapsulating resin is applied to the surface of substrate prior to assembly of the package. Then, as the chip and substrate are brought together in the assembly process, any encapsulating resin that overlies the pads is displaced by pressure of the bumps against the pads during the attachment process. This technique is susceptible to bleed-out of the resin laterally away from the chip edge as well as vertically along the sidewalls of the chip. Bleed-out away from the chip edge requires extra space between adjacent devices, limiting substrate utilization; and vertical bleed-out can result in resin reaching the backside of the chip and, in some instances, contamination of the bonding tool which is used to manipulate the die. Bleed-out is disruptive of the manufacturing process and is therefore undesirable. Moreover, a thermal excursion required to attach a device can cause partial curing of the applied resin on adjacent sites, thereby adversely affecting the quality of the inner connections on adjacent devices. Moreover, there is a practical lower limit on the thinness to which resin material can be applied by dispensing onto a surface or by screen printing, and that limit is generally greater (in some instances two or three times greater: about 100 microns for dispensing; about 50 microns for screen printing) than the bump standoff height (typically, for example, about 50–75 microns before bonding; and as little as about 25–30 microns, for example, after bonding) that is preferred in some small scale flip chip packages.

Both of these approaches entail a dedicated unit process for application of the resin material, usually requiring dedicated equipment for the unit process and adding to both the labor costs and capital depreciation cost of the overall process.

SUMMARY

The invention provides an improved method for encapsulating flip chip interconnects. According to the method, a limited quantity of encapsulating resin is applied to the interconnect side of the chip, and thereafter the chip and substrate are apposed with the corresponding bumps and pads aligned, and then the chip and substrate are brought together under conditions that promote the bonding of the bumps on the metal pads. The resin may be applied to the interconnect side of the chip in any of a variety of ways. I have found, however, that a defined quantity of resin can conveniently and reliably be applied selectively to the chip by dipping the interconnect side of the chip in a pool of the resin to a predetermined depth, and then withdrawing the chip from the resin pool. A quantity of resin, precisely defined by the predetermined depth to which the chip was dipped in the resin pool, remains on the dipped portion of the chip as the chip is withdrawn from the resin pool and brought to the substrate for assembly. Most conveniently and reliably, the pool of resin is provided to a shallow depth in a reservoir, and the chip is dipped into the pool of resin in the reservoir so that the bumps contact the bottom of the reservoir. The predetermined shallow depth of the resin pool thereby determines the quantity of resin that remains on the dipped portion of the chip as the chip is withdrawn from the pool.

Accordingly, in one general aspect the invention features a method for encapsulating flip chip interconnects, by applying a limited quantity of encapsulating resin to the interconnect side of an integrated circuit chip, and thereafter bringing the chip together with a substrate under conditions that promote the bonding of bumps on the interconnect side of the chip with bonding pads on the substrate.

In some embodiments, the step of applying resin to the chip includes dipping the interconnect side of the chip to a predetermined depth in a pool of resin, and then withdrawing the chip from the resin pool. In some embodiments the predetermined depth to which the chip is dipped in the pool approximates the standoff height between the bump surfaces and the chip surface, so that the surface of the resin pool contacts the chip surface, with result that when the chip is withdrawn from the resin pool some quantity of resin may remain on the chip surface as well as on features that standoff from the chip surface. Or, the predetermined depth to which the chip is dipped in the pool is somewhat less than the standoff height, so that the chip surface does not contact the resin pool, with the result that when the chip is withdrawn from the resin pool some quantity of resin remains only on features that standoff from the chip surface, such as the bumps or a portion of the bumps.

In some embodiments the step of applying resin to the chip includes providing a reservoir having a bottom, providing a pool of resin in the reservoir to a shallow depth over the reservoir bottom, dipping the chip into the resin pool so that the bumps contact the reservoir bottom, and then withdrawing the chip from the resin pool. In some such embodiments, the shallow depth of the pool over the reservoir bottom approximates the standoff height between the bumps surfaces and the chip surface, or is somewhat less than the standoff height.

In another general aspect the invention features apparatus for applying a precise volume of encapsulating resin to a chip, including a reservoir having a bottom, and means for dispensing a pool of encapsulating resin to a predetermined depth over the reservoir bottom. In some embodiments the reservoir is at least deep enough to accommodate a pool having a predetermined depth that approximates a bump standoff height on the chip. In some embodiments the means for dispensing the resin pool includes means for dispensing a measured volume of resin into the reservoir. In some embodiments the means for dispensing the resin pool includes means for dispensing an excess of resin into the reservoir, and means such as a doctor for removing the excess; in such embodiments the predetermined depth of the pool is established by the depth of the reservoir itself.

An advantage of the method of the invention is that the resin pattern is self-aligned to the chip, so that there is no requirement according to the invention for alignment of the dispense pattern with the flip chip footprint pattern on the substrate. Moreover the resin is applied according to the invention preferentially to the portions of the interconnect side of the chip on which application of resin is most particularly desired, that is, on hand in the vicinity of the bumps.

The resin reservoir is readily integrated with existing chip attachment equipment, so that there is no need for specialized or dedicated equipment or process steps for applying resin according to the invention.

DETAILED DESCRIPTION

The invention will now be described in further detail by reference to the drawings, which illustrate an embodiment of the invention. The drawings are diagrammatic, showing features of the invention and their relation to other features and structures, and are not made to scale. For improved clarity of presentation, in the Figures, illustrating stages in the method of the invention, elements corresponding to elements shown in other drawings are not all particularly renumbered, although they are all readily identifiable in all the Figures.

Figure 1:
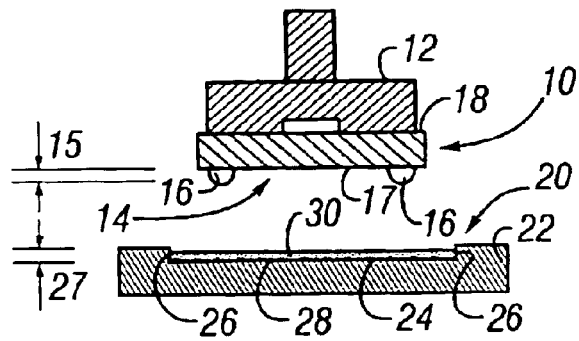
FIGS. 1–5 are a diagrammatic sketches in a partially sectional view illustrating stages in an embodiment of the method of the invention.

Turning now to FIG. 1, there is shown generally at 20 a reservoir formed in a support 22 and generally at 10 an integrated circuit chip being held by a conventional tool 12. The reservoir 28 is defined by a reservoir bottom 24 and sides 26. The reservoir depth is indicated at 27, and the reservoir is here shown filled nearly to its full depth with encapsulation resin forming a resin pool 30. The integrated circuit chip 10 includes a semiconductor die 18 having interconnect bumps 16 attached to interconnect sites (not shown in the Figures) in a chip surface 17. The bump standoff height is indicated at 15. The chip surface 17 and the interconnect bumps 16 together with other features not shown in the Figures. constitute an interconnect side 14 of the chip. In FIG. 1, the tool 12 is poised to move toward the reservoir 20 (as shown by the arrow 11 in FIG. 2) to dip the interconnect side 14 of the chip into the resin pool 30.

Figure 2:
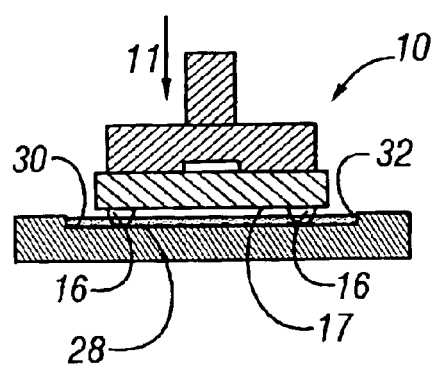

FIG. 2 shows the chip 10 being dipped into the resin pool 30. The bumps 16 have been brought into contact with the reservoir bottom 28, so that the pool depth defines the depth to which the interconnect side of the chip is dipped into the pool. In FIGS. 1 and 2 the pool depth is shown as being slightly less than the reservoir depth 27, and pool depth is also shown as being somewhat less than the bump standoff height 15. As a consequence, in the example shown here, the surface 32 of the resin pool does not come into contact with the chip surface 17 and, accordingly, resin would be expected to remain on only the bumps when the chip is withdrawn from the pool.

Figure 3:
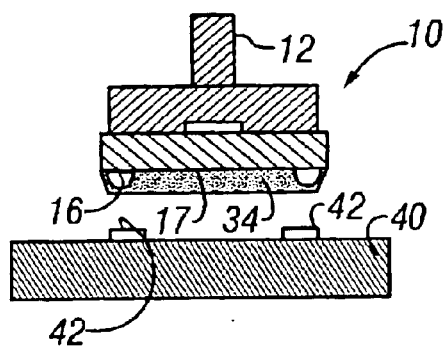

FIG. 3 shows a chip 10 that has been withdrawn from a resin pool. Evidently, the interconnect side of the chip shown in FIG. 3 was dipped to a greater depth in a resin pool than is shown in FIG. 2, inasmuch as in FIG. 3 the resin mass 34 is shown as being carried not only on the bumps 16 but also on the surface 17 of the semiconductor die. As will be appreciated, the quantity of resin in a resin mass carried by the chip after the chip is withdrawn from the resin pool will depend not only upon the extent of contact to the chip with the resin in the pool, but also upon surface characteristics (for example, wettability by the resin) of the various features on the chip and upon characteristics (for example, viscosity) of the resin itself. A desired predetermined depth to which a particular chip should be dipped in a particular resin composition, to result in a particular desired encapsulation form, can readily be determined without undue experimentation. FIG. 3 also shows a package substrate 40 having metal interconnect pads 42 in an arrangement complementary to the arrangement of the bumps on the chip, and the tool 12 is holding the chip in apposition to the substrate with the corresponding bumps and pads aligned. The tool is poised in FIG. 3 to bring the chip and substrate together as shown for example in FIG. 4.

Figure 4:
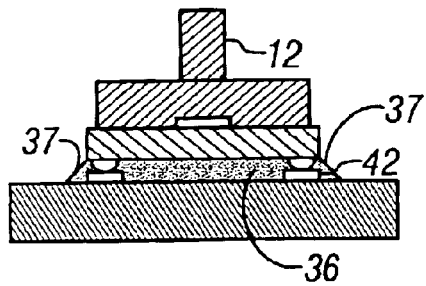
Figure 5:
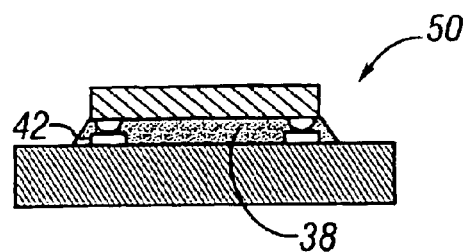

In FIG. 4 the resin mass 36 is shown having been compressed between the chip in the substrate, and displaced by the various features on the interconnect sides of the chip and of the substrate, to form a desired "fillet" 37, at the margins of the gap between the die and substrate, without excessive bleed out. The tool 12 is then released from the die, and encapsulating resin is cured to form a completed encapsulation 38 of the package 50 as shown in FIG. 5. Some deformation of the bumps during the attachment operation can be expected, resulting in a reduction of the standoff height. This can further compress the resin and force it into asperities formed by the circuit pattern on the substrate surface as well as by features on the interconnect side of the chip, resulting in improved encapsulation integrity.

Other embodiments are within the following claims.

What is claimed is:

1. A method for encapsulating flip chip interconnects, comprising applying a limited quantity of encapsulating resin to at least interconnect bumps on an interconnect side of a singulated integrated circuit chip, wherein the step of applying resin to the chip comprises providing a reservoir having a bottom and sides, providing a pool of resin in the reservoir to a depth not greater than a bump standoff height, dipping the bumps on the interconnect side of the chip in the resin pool so that bumps on the chip contact the reservoir bottom, and then withdrawing the chip from the resin pool; and thereafter bringing the chip together with a substrate under conditions that result in displacement of encapsulant from between the bumps on the interconnect side of the chip and respective bonding pads on the substrate, and that promote the bonding of bumps with the respective pads.

2. The method of claim 1 wherein the resin pool depth approximates the bump standoff height.

3. The method of claim 1 wherein the resin pool depth is less than the bump standoff height.

4. A method for encapsulating flip chip interconnects, comprising applying a limited quantity of encapsulating resin to the interconnect side of an integrated circuit chip by providing a pool of resin in a reservoir having a bottom and sides, the resin pool having a depth over the reservoir bottom not greater than about a bump standoff height, dipping the interconnect side of the chip in the pool of resin so that bumps on the chip contact the reservoir bottom and then withdrawing the chip from the resin pool; and thereafter bringing the chip together with a substrate under conditions that promote the bonding of bumps on the interconnect side of the chip with bonding pads on the substrate.

5. The method of claim 4 wherein the resin pool depth approximates a bump standoff height, so that the surface of the resin pool contacts a surface of the chip, so that as the chip is withdrawn from the resin pool some quantity of resin may remain on the chip surface as well as on features that standoff from the chip surface.

6. The method of claim 4 wherein the resin pool depth is less than the bump standoff height, so that the chip surface does not contact the resin pool, with the result that when the chip is withdrawn from the resin pool some quantity of resin remains only on features that standoff from the chip surface.

7. A method for encapsulating flip chip interconnects, comprising applying a limited quantity of encapsulating resin to the interconnect side of an integrated circuit chip by providing a reservoir having a bottom and sides, the sides defining a reservoir depth not greater than about a bump standoff height, providing a pool of resin in the reservoir, dipping the chip into the resin pool so that bumps on the chip contact the reservoir bottom, and then withdrawing the chip from the resin pool; and thereafter bringing the chip together with a substrate under conditions that promote the bonding of bumps on the interconnect side of the chip with bonding pads on the substrate.

8. The method of claim 7 wherein the reservoir depth approximates the bump standoff height.

9. The method of claim 7 wherein the reservoir depth is less than the standoff height.

* * * * *

UNITED STATES PATENT AND TRADEMARK OFFICE
CERTIFICATE OF CORRECTION

PATENT NO. : 6,780,682 B2  
APPLICATION NO. : 10/081425  
DATED : August 24, 2004  
INVENTOR(S) : Rajendra D. Pendse Page 1 of 1

It is certified that error appears in the above-identified patent and that said Letters Patent is hereby corrected as shown below:

Item (60) on the Title Page: Please replace "10/272,280" with -- 60/272,280 --.

Signed and Sealed this
Sixteenth Day of June, 2015

Michelle K. Lee
*Director of the United States Patent and Trademark Office*